(12) United States Patent
Hunt et al.

(10) Patent No.: US 10,887,996 B2
(45) Date of Patent: Jan. 5, 2021

(54) ELECTRONIC COMPONENTS COATED WITH A TOPOLOGICAL INSULATOR

(71) Applicant: The Boeing Company, Chicago, IL (US)

(72) Inventors: Jeffrey H. Hunt, Thousand Oaks, CA (US); Angela W. Li, Everett, WA (US); Wayne R. Howe, Irvine, CA (US)

(73) Assignee: THE BOEING COMPANY, Chicago, IL (US)

(*) Notice: Subject to any disclaimer, the term of this patent is extended or adjusted under 35 U.S.C. 154(b) by 279 days.

(21) Appl. No.: 15/815,572

(22) Filed: Nov. 16, 2017

(65) Prior Publication Data

US 2019/0150289 A1 May 16, 2019

(51) Int. Cl.
*H05K 3/00* (2006.01)
*G06F 1/18* (2006.01)
(Continued)

(52) U.S. Cl.
CPC ............ *H05K 3/0011* (2013.01); *G06F 1/183* (2013.01); *H05K 5/065* (2013.01); *H05K 13/00* (2013.01);
(Continued)

(58) Field of Classification Search
CPC ...... H05K 3/0011; H05K 5/065; H05K 13/00; H05K 13/08; G06F 1/183
See application file for complete search history.

(56) References Cited

U.S. PATENT DOCUMENTS

| 5,508,489 A | 4/1996 | Benda et al. |
| 6,815,636 B2 | 11/2004 | Chung et al. |

(Continued)

FOREIGN PATENT DOCUMENTS

| CN | 103454602 | * 12/2013 |
| CN | 103553000 A | 2/2014 |

(Continued)

OTHER PUBLICATIONS

"Topological Insulator Bi2Se3/Si-Nanowire-Based p-n Junction Diode for High-Performance Near-Infrared Photodetector", Biswajit Das, Nirmalya S. Das, Samrat Sarkar, Biplab K. Chatterjee, and Kalyan K. Chattopadhyay, ACS Appl. Mater. Interfaces 2017, 9, 22788-22798. (Year: 2017).*

(Continued)

*Primary Examiner* — David P Turocy
*Assistant Examiner* — Mohammad Mayy
(74) *Attorney, Agent, or Firm* — MH2 Technology Law Group LLP (57) ABSTRACT

A method for increasing a service lifetime of an electronic component includes applying a topological insulator coating layer on a surface of the electronic component and performing a test on the electronic component with the topological insulator coating layer applied thereto. The electronic component with the topological insulator coating layer exhibits at least a 100% improvement during the test when compared to an otherwise equivalent electronic component without the topological insulator layer applied thereto. The electronic component with the topological insulator coating layer exhibits at least a 100% improvement during the test when compared to an otherwise equivalent electronic component with a graphene layer applied thereto. The test includes at least one of: a waterproofness test, an acetic acid test, a sugar solution test, and a methyl alcohol test.

30 Claims, 2 Drawing Sheets

(51) Int. Cl.
H05K 5/06 (2006.01)
H05K 13/08 (2006.01)
H05K 13/00 (2006.01)
B82Y 99/00 (2011.01)
B82Y 30/00 (2011.01)

(52) U.S. Cl.
CPC .............. *H05K 13/08* (2013.01); *B82Y 30/00* (2013.01); *B82Y 99/00* (2013.01); *H05K 2203/163* (2013.01)

(56) References Cited

U.S. PATENT DOCUMENTS

| | | | |
|---|---|---|---|
| 7,515,986 | B2 | 4/2009 | Huskamp |
| 9,296,007 | B2 | 3/2016 | Li et al. |
| 9,630,209 | B2 | 4/2017 | Hunt et al. |
| 9,632,542 | B2 | 4/2017 | Li et al. |
| 9,732,418 | B2 | 8/2017 | Li et al. |
| 9,748,345 | B2 | 8/2017 | Sharma |
| 2010/0140723 | A1 | 6/2010 | Kurtz et al. |
| 2012/0138887 | A1 | 6/2012 | Zhang et al. |
| 2014/0199542 | A1 | 7/2014 | Li et al. |
| 2014/0216513 | A1* | 8/2014 | Mantese ............ H01L 35/32 136/200 |
| 2015/0165556 | A1 | 6/2015 | Jones et al. |
| 2015/0174695 | A1 | 6/2015 | Elfstroem et al. |
| 2015/0255184 | A1* | 9/2015 | Li .................... H01L 23/29 428/336 |
| 2015/0257308 | A1 | 9/2015 | Li et al. |
| 2016/0082617 | A1 | 3/2016 | Howe et al. |
| 2016/0116679 | A1 | 4/2016 | Muendel et al. |
| 2016/0158889 | A1 | 6/2016 | Carter et al. |
| 2016/0168692 | A1 | 6/2016 | Li et al. |
| 2016/0204376 | A1* | 7/2016 | Lu ................... H01L 51/5253 257/40 |
| 2016/0364062 | A1 | 12/2016 | Lu et al. |
| 2017/0090119 | A1 | 3/2017 | Logan et al. |
| 2017/0173737 | A1 | 6/2017 | Gray |
| 2017/0194144 | A1 | 7/2017 | Duan et al. |
| 2017/0306476 | A1 | 10/2017 | Li et al. |

FOREIGN PATENT DOCUMENTS

| | | |
|---|---|---|
| CN | 107620034 A | 1/2018 |
| WO | WO 2013/086227 A1 | 6/2013 |

OTHER PUBLICATIONS

CN 103454602 A Google Patents (Year: 2013).*
Ando et al., "Topological Insulator Materials," Journal of the Physical Society of Japan, Invited Review Papers, 2013, pp. 1-36.
Hasan et al., "Colloquium: Topological Insulators," The Amer. Phys. Soc., Reviews of Modern Physics, vol. 82, Oct.-Dec. 2010, pp. 3045-3067.
Hills et al., "From Graphene and Topological Insulators to Weyl Semimetals," WSPC/Instruction File, 2015, pp. 1-33.
Hla, "Single Atom Extraction by Scanning Tunneling Microscope Tip-Crash and Nanoscale Surface Engineering," Nanoscale & Quantum Phenomena Institute, Physics & Astronomy Department, Ohio University, Athens, OH, date unknown, pp. 1-15.
Hla, "STM Single Atom/Molecule Manipulation and Its Application to Nanoscience and Technology," Critical Review article, J. Vac. Sci. Tech, 2005, p. 1-12.
Khanikaev et al., Photonic Topological Insulators, Nature Materials, vol. 12, Mar. 2013, pp. 233-239.
Kong et al., "Opportunities in Chemistry and Materials Science for Topological Insulators and Their Nanostructures," Nature Chemistry, vol. 3, Nov. 2011, pp. 845-849.
Kuzmenko et al., Universal Dynamical Conductance in Graphite, *DPMC*, University of Geneva, Switzerland, 2007, pp. 1-5.
Li et al., "Marginal Topological Properties of Graphene: a Comparison with Topological Insulators," *DPMC*, University of Geneva, Switzerland, 2012, pp. 1-9.
Mak et al., "Optical Spectroscopy of Graphene: From the Far Infrared to the Ultraviolet," Solid State Communications, 152 (2012), 1341-1349.
Mingareev et al., "Laser Additive Manufacturing Going Mainstream," Optics and Photonics News, Feb. 2017, 8 pages.
Moore, "The Birth of Topological Insulators," Nature, vol. 464, Insight Perspective (2010), pp. 194-198.
Peng et al., "Topological Insulator Nanostructures for Near-Infrared Transparent Flexible Electrodes," Nature Chemistry, vol. 4, Apr. 2012, pp. 281-286.
Qi et all, "Topological Insulators and Superconductors," arXiv:1008.2026v1 [cond-mat.mes-hall], (2010), pp. 1-54.
Zhang, "Viewpoint: Topological States of Quantum Matter," American Physical Society, Physics 1, 6 (2008), 3 pages.
Zhu et al., "Optical Transmittal of Multilayer Graphene," EPL, 108 (2014) 17007, 4 pages.
Gu, "Chapter 2—Laser Additive Manufacturing (AM): Classification, Processing Philosophy, and Metallurgical Mechanisms," Laser Additive Manufacturing of High-Performance Materials, 2015, XVII, pp. 15-24.
Wikipedia, Graphene, https://en.wikipedia.org/wiki/Graphene, 29 pages, downloaded Nov. 15, 2017.
Wikipedia, Scanning Tunneling Microscope, https://en.wikipedia.org/wiki/Scanning_Tunneling_Microscope, 9 pages.
Wikipedia, "Nanometre," https://en.wikipedia.org/wiki/Nanometre, 2 pages.
Wikipedia, "Carbon Nanotube," https://en.wikipedia.org/wiki/Carbon_Nanotube, 22 pages.
Du et al., "Robustness of topological surface states against strong disorder observed in Bi2Te3 nanotubes," Physical Review B 93, 195402 (2016), 10 pages.
Guo et al., "Selective-Area Van der Waals epitaxy of topological insulator grid nanostructures for broadband transparent flexible electrodes," Advanced Materials, 2013, 25, 5959-5964.

* cited by examiner

ELECTRONIC COMPONENTS COATED WITH A TOPOLOGICAL INSULATOR

FIELD OF THE DISCLOSURE

The present disclosure is directed to systems and methods for coating electronic components.

BACKGROUND

Electronic components and electrical connections can be sensitive to environmental elements (e.g., temperature, pressure, humidity, etc.). For example, extreme changes in temperature, pressure, and/or humidity, such as experienced in some aerospace applications, can lead to undesirable effects on component or connections. To prevent such effects, these components and connections are often coated to prevent their exposure to the environmental elements, thus increasing their service life.

In many applications, the components and connections may need to be visible or transparent to a specific wavelength of electromagnetic radiation during normal operation to transmit and receive signals. In these situations, conformal coatings are sometimes used. However, conformal coatings are oftentimes heavy and/or bulky, adding excess weight and/or taking up excessive volume. In many applications, such as aerospace applications, additional weight and volume are undesirable. Therefore, there exists a need for enhanced coatings for electronic components and connections.

SUMMARY

A method for increasing a service lifetime of an electronic component is disclosed. The method includes applying a topological insulator coating layer on a surface of the electronic component and performing a test on the electronic component with the topological insulator coating layer applied thereto. The electronic component with the topological insulator coating layer exhibits at least a 100% improvement during the test when compared to an otherwise equivalent electronic component without the topological insulator layer applied thereto. The electronic component with the topological insulator coating layer exhibits at least a 100% improvement during the test when compared to an otherwise equivalent electronic component with a graphene layer applied thereto. The test includes at least one of: a waterproofness test, an acetic acid test, a sugar solution test, and a methyl alcohol test.

An electronic device is also disclosed. The electronic device includes an electronic component that includes an electrical contact, a transformer, a resistor, a capacitor, an inductor, a microprocessor, an integrated circuit, a memory device, a circuit board, or a combination thereof. A three-dimensional topological insulator coating layer is disposed on a surface of the electronic component. The topological insulator coating layer includes at least one element selected from bismuth and antimony. The topological insulator coating layer has a thickness ranging from about 10 nm to about 100 nm. The electronic component with the topological insulator coating layer exhibits at least a 1000% improvement during each of multiple tests when compared to an otherwise equivalent electronic component without the topological insulator layer applied thereto. The electronic component with the topological insulator coating layer exhibits at least a 1000% improvement during each of multiple tests when compared to an otherwise equivalent electronic component with a graphene layer applied thereto. The multiple tests include: a waterproofness test, an acetic acid test, a sugar solution test, and a methyl alcohol test.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate aspects of the present teachings and together with the description, serve to explain the principles of the present teachings.

It should be noted that some details of the figures have been simplified and are drawn to facilitate understanding rather than to maintain strict structural accuracy, detail, and scale.

DESCRIPTION

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

The present disclosure is directed to electronic components having a coating applied thereto. The electronic component can be coupled to the interior or exterior of a vehicle such as a spacecraft, airplane, submarine, automobile, building, or other structure. Application of the coating can enable the electronic component to be used in air, water, space, a toxic chemical environment, or other environment.

The coating can be or include a topological insulator (TI). More particularly, a TI coating can be applied to or disposed on an environment-facing surface of the electronic component. An "environment-facing" surface refers to any surface that is exposed to the external environment of the component. The environment-facing surface can thus be exposed to various conditions and/or stimuli. For example, in some implementations, the environment-facing surface can be exposed to extreme temperature, pressure, humidity, airborne contaminants, etc. The environment-facing surface can also be exposed to rain, liquid spills, or other accidents that can occur in the vicinity of the electronic component. In some implementations, the environment-facing surface can be exposed to and/or oriented toward the interior of a vehicle or other environment. For example, in some instances, the environment-facing surface can be exposed to and/or oriented toward a passenger compartment and/or cockpit of an airplane cabin. Alternatively, in other cases, the environment-facing surface can be exposed to and/or oriented toward the exterior of a vehicle or other environment. In one specific example, the electronic component, with the TI coating applied thereto, can be coupled or adhered to the exterior surface of an aircraft.

The TI coating can provide enhanced protection from environmental exposure without significantly increasing the total volume or mass of the electronic component. For example, in some implementations, an electronic component with a TI coating can exhibit an increased water-in-air contact angle on the environment-facing surface of the electronic component and/or increased corrosion resistance compared to an uncoated electronic component or compared to an electronic component with a graphene coating. Moreover, the TI coating can have a reduced thickness and/or improved optical transparency compared to some other coatings (e.g., graphene) that are applied to electronic components.

The benefit or technical effect of applying a TI coating layer on an environment-facing surface of the electrical component is that the TI coating layer has more variability than a graphene coating layer. More particularly, the TI coating layer can have a different geometry than a graphene coating layer, which is a benefit that allows the TI coating layer to take on different shapes and be applied to different surfaces than a graphene coating layer. Moreover, the dielectric properties of the TI coating layer (e.g., resistance and insulative properties) can be specifically tailored because the TI coating layer involves multiple species, whereas the same properties cannot be tailored in a graphene coating layer. In addition, the diameter, thickness, and angle of adhesion of the TI coating layer can be modified, whereas the same properties of a graphene coating layer cannot be modified (i.e., they are set). The modifications can include different geometrical properties or dopants that are added, which can modify the TI coating layer properties. Furthermore, the manufacturing of the TI coating layer can be easier than a graphene coating layer. For example, when using a CVD process, a hydrogen atmosphere needs to be maintained to produce a graphene coating layer, but the hydrogen layer does not need to be maintained to produce the TI coating layer.

Figure 1:
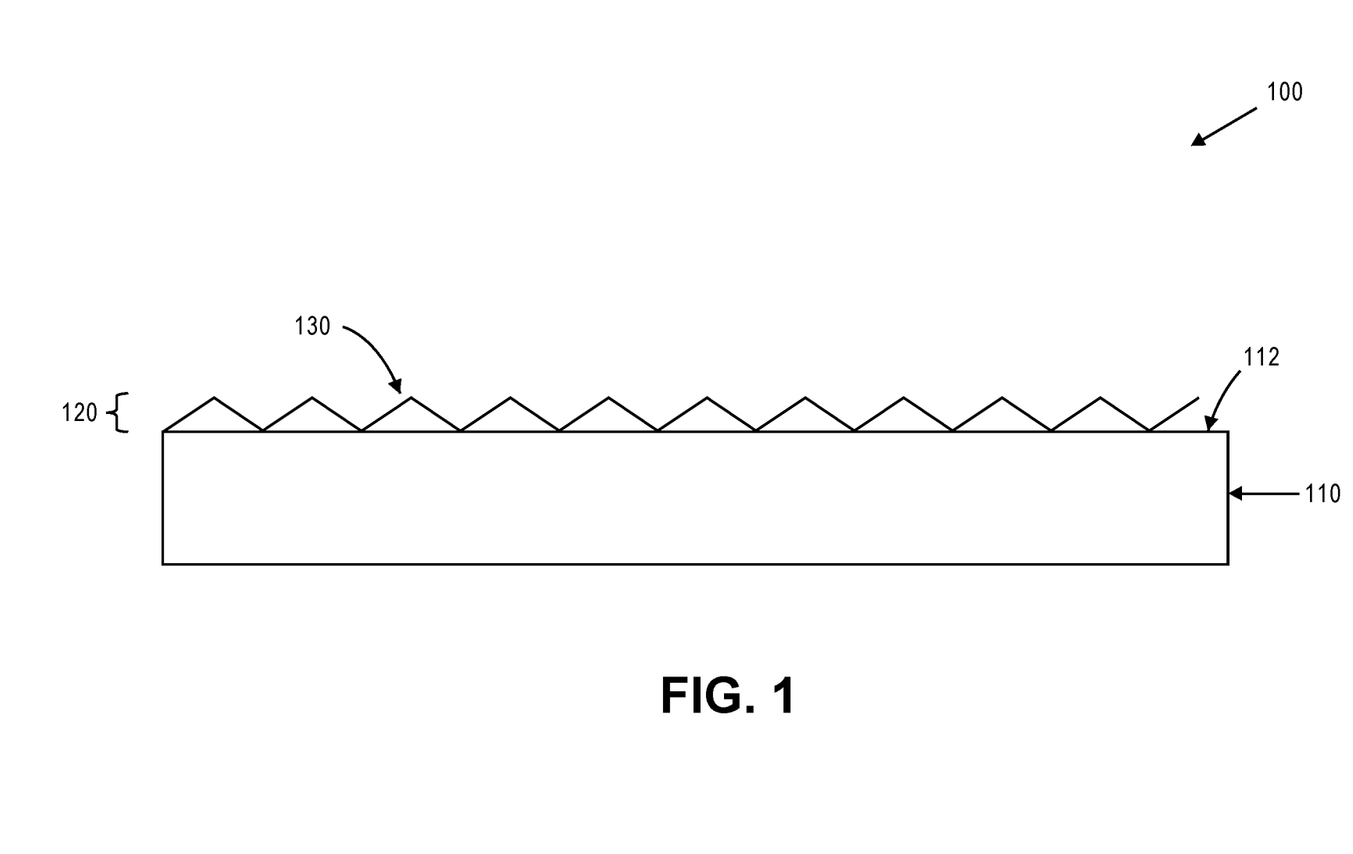
FIG. 1 illustrates a schematic, cross-sectional view of an electrical device, according to an implementation of the present disclosure.

FIG. 1 illustrates a side view of an electrical device 100. The electrical device 100 includes an electronic component 110. The electronic component 110 can be or include an electronic sensor, a radar, an antenna, a dish antenna, a humidity detector, an audio detector, a nuclear detector, a biosensor, or the like. For example, the electronic component 110 can be or include one or more electrical contacts, transformers, resistors, capacitors, inductors, microprocessors, integrated circuits, memory devices, circuit boards, or a combination thereof. In one particular implementation, the electronic component 110 includes a circuit board such as a printed circuit board, which can include one or more electronic connections or connectors.

Moreover, the electronic component 110 can include or be formed from any suitable material. For example, in some implementations, the electronic component 110 can include or be formed from a laminate such as a copper-clad laminate, a resin impregnated B-stage cloth, an epoxy, a liquid photoimageable solder mask ink, and/or a dry film photoimageable solder mask. In some implementations, the electronic component 110 can include or be formed from a semiconductor material such as Si, Ge, or InP; a metal such as aluminum, stainless steel, gold, silver, or cooper; and/or a dielectric material such as sapphire, $SiO_2$, and SiC. Any other suitable materials can also be used.

The electronic component 110 is depicted schematically in FIG. 1 as having a rectangular cross-section and a flat planar surface. However, other implementations are also possible. For example, in some implementations, the electronic component 110 can have a circular, elliptical, or other cross sectional shape. Similarly, an environment-facing surface 112 of the electronic component 110 can have a curvature, including a convex curvature, a concave curvature, or a periodic or undulating curvature. Further, the surface 112 of the electronic component 110 can have one or more electronic subcomponents disposed thereon, creating a textured or irregular surface. For example, in some cases, one or more transformers, resistors, capacitors and/or inductors can be disposed on the surface 112.

A coating layer 120 can be applied to or disposed on the surface 112 of the electronic component 110. The coating layer 120 can be or include a non-carbon based topological insulator (TI) 130. As used herein, the term "topological insulator" means a two-dimensional ("2D") or three-dimensional ("3D") material with time-reversal symmetry and topologically protected edge states (2D) or surface states (3D). For example, a 2D topological insulator generally will not conduct current across the surface of the 2D material, but can carry current along the edges of the 2D material. In another example, a 3D topological insulator generally will not conduct current through the bulk of the 3D material, but can carry current along the surface of the 3D material. As used herein, the term "non-carbon-based topological insulator" means a topological insulator whose crystal structure does not include carbon.

The topological insulator 130 is depicted schematically in FIG. 1 by a line resembling an alkane chain. When the surface 112 of the electronic component 110 includes electronic subcomponents (e.g., transformers, resistors, capacitors and/or inductors) as mentioned above, the topological insulator 130 can be disposed over the subcomponents. One benefit or technical effect of the coating layer 120 be that the coating layer 120 can have a different geometry than a graphene coating layer, allowing the coating layer 120 to take on different shapes and be applied to different surfaces (e.g., of the electrical components), while a graphene coating layer can be incapable of being applied to such surfaces.

The topological insulator 130 may include at least one element selected from bismuth and antimony. In one example, the topological insulator 130 can include at least one compound selected from bismuth selenide ($Bi_2Se_3$), bismuth telluride ($Bi_2Te_3$), antimony telluride ($Sb_2Te_3$), boron nitride (BN), bismuth tellurium (BiTe), molybdenite ($MoS_2$), bismuth antimonide (BiSb), mercury telluride (HgTe), cadmium Telluride (CdTe), bismuth selenide ($Bi_2Se_3$), or a combination thereof.

Some 2D, non-carbon-based topological insulators 130 can include antimony (Sb), bismuth (Bi), selenium (Se), or tellurium (Te), or combinations thereof. For example, some 2D, non-carbon-based topological insulators 130 can include CdTe/HgTe/CdTe quantum wells, AlSb/InAs/GaSb/AlSb quantum wells, Bi bilayers, monolayer low-buckled HgSe, monolayer low-buckled HgTe, strained HgTe, or silicene, or combinations thereof. Some 3D, non-carbon-based topological insulators 130 can include antimony (Sb), bismuth (Bi), selenium (Se), or tellurium (Te), or combinations thereof. For example, some 3D, non-carbon-based topological insulators 130 can include $Bi_{1-x}Sb_x$ ($0<x<1$) (e.g., $Bi_{0.9}Sb_{0.1}$), $Bi_{1-x}Te_x$ ($0<x<1$), $Bi_{1-x}Te_x$ ($0<x<1$), Sb, $Bi_2Se_3$, $Bi_2Te_3$, $Sb_2Te_3$, $Bi_2Te_2Se$, $(Bi,Sb)_2Te_3$ (e.g., $(Bi_{0.2}Sb_{0.8})_2Te_3$), $Bi_{2-x}Sb_xTe_{3-y}Se_y$ ($0 \leq x \leq 2$; $0 \leq y \leq 3$), $Bi_{2-x}Sb_xTe_{3-y}Se_y$ ($0 \leq x \leq 2$; $1 \leq y \leq 3$) (e.g., $Bi_2Te_{1.95}Se_{1.05}$, $BiSbTe_{1.25}Se_{1.75}$), $Bi_2Te_{1.6}S_{1.4}$, $Bi_{1.1}Sb_{0.9}Te_2S$, $Sb_2Te_2Se$, $Bi_2(Te,Se)_2(Se,S)$, $TlBiSe_2$, $TlBiTe_2$, $TlBi(S_{1-x}Se_x)_2$ ($0.5 \leq x \leq 1$), $Pb(Bi_{1-x}Sb_x)_2Te_4$ ($0 \leq x \leq 1$), $PbBi_2Te_4$, $PbSb_2Te_4$, $PbBi_4Te_7$, $GeBi_2Te_4$, $GeBi_{4-x}Sb_xTe_7$ ($0 \leq x \leq 4$), $(PbSe)_5(Bi_2Se_3)_3$, $(PbSe)_5(Bi_2Se_3)_6$, $(Bi_2)(Bi_2Se_{2.6}S_{0.4})$, $Bi_4Se_3$, $Bi_4Se_{2.6}S_{0.4}$, $(Bi_2)(Bi_2Te_3)_2$, $SnTe$, $Pb_{1-x}Sn_xSe$ ($0<x<1$), $Pb_{1-x}Sn_xTe$ ($0<x<1$), $Pb_{0.77}Sn_{0.23}Se$, $Bi_{1.84-x}Fe_{0.16}Ca_xSe_3$ ($0 \leq x<1.84$), $Cr_{0.08}(Bi_{0.1}Sb_{0.9})_{1.92}Te_3$, $(Dy_xBi_{1-x})_2Te_3$ ($0<x<1$), $Ni_xBi_{2-x}Se_3$ ($0<x<2$), $(Ho_xBi_{1-x})_2Se_3$ ($0 \leq x<1$), $Ag_2Te$, $SmB_6$, $Bi_{14}Rh_3I_9$, $Bi_{2-x}Ca_xSe_3$ ($0<x<2$), $Bi_{2-x}Mn_xTe_3$ ($0<x<2$) (e.g., $Bi_{1.91}Mn_{0.09}Te_3$, $Bi_{1.96}Mn_{0.04}Te_3$, $Bi_{1.98}Mn_{0.02}Te_3$), $Ba_2BiBrO_6$, $Ba_2BiIO_6$, $Ca_2BiBrO_6$, $Ca_2BiIO_6$, $Sr_2BiBrO_6$, or $Sr_2BiIO_6$, or combinations thereof.

Employing the compounds above can modify the dielectric properties of the topological insulators 130 (e.g., resistance and insulative properties) to allow the properties to be specifically tailored, whereas the same properties cannot be tailored in graphene. In addition, the diameter, thickness, and angle of adhesion of the topological insulators 130 can be modified, whereas the same properties of graphene cannot be modified (i.e., they are set).

The coating layer 120 can include a two-dimensional monolayer or a three-dimensional layer having any desired thickness described herein. The two-dimensional or three-dimensional topological insulators 130 can have a different geometry than graphene, allowing the topological insulators 130 to be applied to different surfaces than graphene.

The coating layer 120 can include one or more layers of the topological insulator 130. The layers of the topological insulator 130 can be stacked so that each layer of the plurality of layers physically contacts at least one adjacent layer of the plurality of layers. Any number of topological insulators 130 can be employed. For example, the coating layer 120 can include 2 to 25 layers or more of the topological insulator 130, such as 5 to 20 layers. This enables the TI coating layer 120 to have a different geometry than a graphene coating layer, allowing the TI coating layer 120 to take on different shapes and be applied to different surfaces than a graphene coating layer.

Unlike graphene, which has significantly reduced thermal conductivity except where it is employed in very thin layers, the non-carbon based topological insulator 130 can be made thicker while still maintaining high thermal conductivity of the two-dimensional material. The coating layer 120 can have any suitable thickness that will provide a desired heat transfer away from the electrical component 110. For example, the coating layer 120 can have a thickness ranging from about 10 nm to about 10 μm, such as about 10 nm to about 1 μm, about 10 nm to about 100 nm, about 20 nm to about 10 μm, about 30 nm to about 1 μm, or about 40 nm to about 100 nm. Any other suitable thicknesses can also be employed. The thickness can allow the TI coating layer 120 to have a different geometry than a graphene coating layer, allowing the TI coating layer 120 to take on different shapes and be applied to different surfaces than a graphene coating layer.

In addition, in some cases, an intermediary insulating material layer (not shown) can be disposed between the surface 112, including the one or more electronic subcomponents that can be disposed on the surface 112, and the coating layer 120. The intermediary insulating material layer can be or include an electrical insulating layer, an adhesion layer for improving adhesion between the coating layer 120 and the electrical component 110, and/or a thermally conductive layer for enhancing thermal conduction between the electrical component 110 and the coating layer 120. In an example, the intermediary insulating material layer can be or include an insulating layer selected from an organic or inorganic electrical insulating material, such as a polymer, plastic, silicon dioxide, ceramic, or other suitable material.

The intermediary insulating material layer can have any suitable thickness, such as, for example, a thickness ranging from about 10 nm to about 10 μm, such as about 50 nm to about 5 μm, or about 100 nm to about 1 μm.

Figure 2:
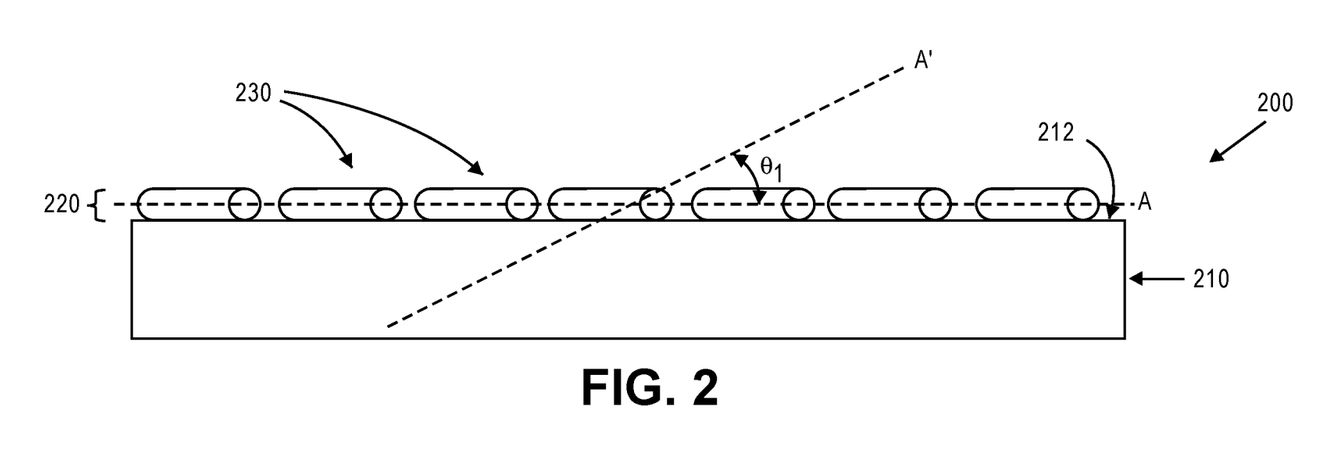
FIG. 2 illustrates a schematic, cross-sectional view of an electrical device, according to an implementation of the present disclosure.

FIG. 2 illustrates an electrical device 200 including an electronic component 210. The electronic component 210 can be similar to the electronic component 110 discussed above. The electronic component 210 can have a coating layer 220 applied to or disposed on an environmentally-facing surface 212 of the electronic component 210. The coating layer 220 can include a plurality of nanotubes made from a non-carbon based topological insulator that are substantially horizontal or substantially vertical with respect to the environment-facing surface 212 of the electronic component 210.

One or more optional layers (not shown), such as an electrical insulating layer, an adhesion layer, or a thermally conductive layer, can be positioned between the surface 212 and the coating layer 220. In the implementation of FIG. 2, the coating layer 220 includes a plurality of topological insulator nanotubes 230 oriented horizontally or substantially horizontally on the surface 212 of the electrical component 210. For reference purposes herein, a "horizontal" orientation includes an orientation wherein the long axis of a topological insulator nanotube 230 is oriented parallel to the surface 212. In the implementation of FIG. 2, all of the topological insulator nanotubes 230 are depicted as having a long axis oriented parallel to the surface 212. However, other arrangements are possible. For example, in some implementations, one or more topological insulator nanotubes 230 can have a long axis along line A' in FIG. 2 or along some other direction that is not parallel to the surface 212. As defined herein, a "substantially horizontal" orientation is an orientation wherein the long axis (A') of a topological insulator nanotube 230 forms an angle ($\theta_1$) of less than about 45 degrees with a line (A) parallel to the surface 212 of the electrical component 210. In some implementations, the angle ($\theta_1$) is less than about 30 degrees or less than about 15 degrees. In some implementations, the angle ($\theta_1$) is between about 0 degrees and about 30 degrees. In some implementations, a majority of the topological insulator nanotubes 230 of the coating layer 220 have a horizontal or substantially horizontal orientation. Further, in some implementations, at least about 60 percent, at least about 70 percent, at least about 80 percent, or at least about 90 percent of the topological insulator nanotubes 230 have a horizontal or substantially horizontal orientation.

Figure 3:
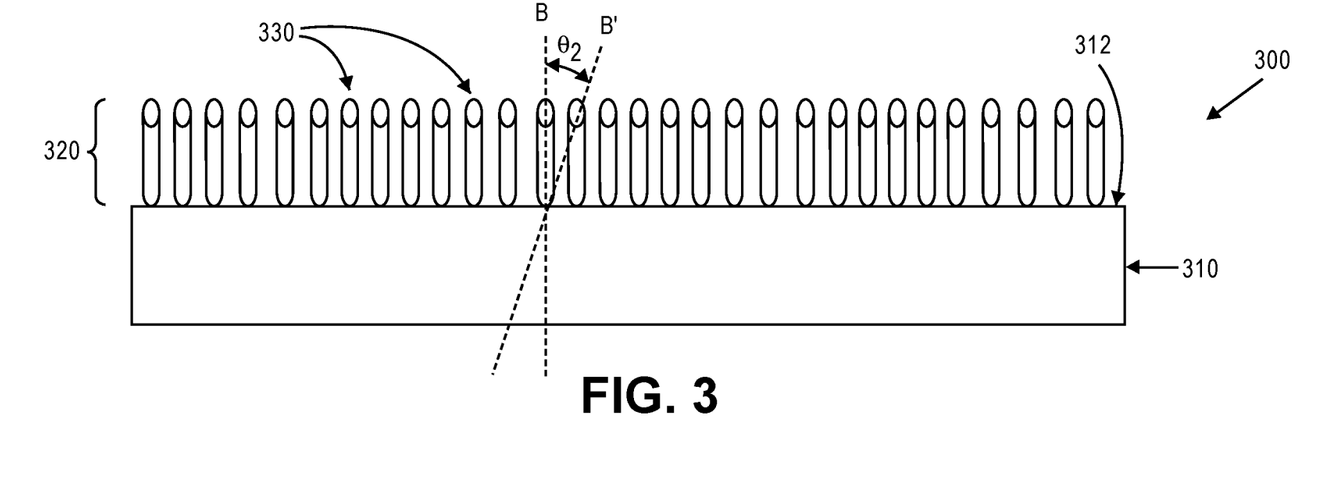
FIG. 3 illustrates a schematic, cross-sectional view of an electrical device, according to an implementation of the present disclosure.

In other implementations, the topological insulator nanotubes of the coating layer can be oriented vertically or substantially vertically. For example, with reference to FIG. 3, an electrical device 300 includes an electrical component 310 and a coating layer 320 disposed on an environmentally-facing surface 312 of the electrical component 310. One or more optional layers (not shown), such as an electrical insulating layer, an adhesion layer, or a thermally conductive layer, can be positioned between the surface 312 and the coating layer 320. In the implementation of FIG. 3, the coating layer 320 includes a plurality of topological insulator nanotubes 330 oriented vertically or substantially vertically on the surface 312 of the electrical component 310. Vertical orientation is relative to the surface 312. For reference purposes herein, a "vertical orientation" includes an orientation wherein the long axis of a topological insulator nanotube 330 is oriented perpendicular to the surface 312. In the implementation of FIG. 3, all of the topological insulator nanotube 330 are depicted as having a long axis oriented perpendicular to the surface 312. However, other arrangements are possible. For example, one or more topological insulator nanotubes 330 can have a long axis along line B' in FIG. 3 or along some other direction that is not perpendicular to the surface 312. A "substantially vertical" orientation, as defined herein, is an orientation wherein the long axis (B') of a topological insulator nanotube forms an angle ($\theta_2$) of less than about 45 degrees with a line (B) perpendicular to the surface of the electrical component 310. In some implementations, the angle ($\theta_2$) is less than about 30 degrees or less than about 15 degrees. In some implementations, the angle ($\theta_2$) is between about 0 degrees and about 30 degrees. In some implementations, a majority of the topological insulator nanotubes 330 have a vertical or substantially vertical orientation. Further, in some implementations described herein, at least about 60 percent, at least about 70 percent, at least about 80 percent, or at least about 90 percent of the topological insulator nanotubes 330 have a vertical or substantially vertical orientation. There are different component geometries and different types of packaging that can benefit from different alignments of the nanotubes. These can vary depending upon the tradeoffs between geometries and physical properties. For example, if the nanotubes are absolutely vertical, they can provide strong insulator or resistive strength in the vertical direction. But that can potentially cause packaging problems, with the layer being too thick. Tilting the layer slightly away from vertical can maintain the electrical properties, albeit to a lesser extent, while reducing the overall volume of the nanotube structure.

In addition, the coating layer described herein can include of a monolayer of topological insulator nanotubes, including a monolayer of horizontally or substantially horizontally oriented topological insulator nanotubes or a monolayer of vertically or substantially vertically oriented topological insulator nanotubes.

The benefit or technical effect of using TI nanotubes can be that the TI nanotubes have more variability than graphene. More particularly, the TI nanotubes can have a different geometry than graphene, allowing the TI coating layer to take on different shapes and be applied to different surfaces than a graphene coating layer. Moreover, the dielectric properties of the TI nanotubes (e.g., resistance and insulative properties) can be specifically tailored, whereas the same properties cannot be tailored in a graphene coating layer. In addition, the diameter, thickness, and angle of adhesion of the TI nanotubes can be modified, whereas the same properties of a graphene coating layer cannot be modified (i.e., they are set). The modifications can include different geometrical properties or dopants that are added. Furthermore, the manufacturing of the TI coating layer can be easier than a graphene coating layer. For example, when using a CVD process, a hydrogen atmosphere needs to be maintained to produce a graphene coating layer, but the hydrogen layer does not need to be maintained to produce the TI coating layer.

Moreover, a TI coating layer as described herein can have any thickness not inconsistent with the objectives of the present disclosure. For example, the coating layer can have an average thickness of about 300 nm or less, about 200 nm or less, about 100 nm or less, about 50 nm or less, about 10 nm or less, about 5 nm or less, about 3 nm or less, about 2 nm or less, or about 1 nm or less. In some implementations, the coating layer described herein can have an average thickness between about 1 nm and about 300 nm, between about 1 nm and about 200 nm, between about 1 nm and about 100 nm, between about 10 nm and about 300 nm, between about 10 nm and about 200 nm, between about 10 nm and about 100 nm, between about 50 nm and about 300 nm, between about 50 nm and about 200 nm, between about 50 nm and about 100 nm, or between about 100 nm and about 300 nm.

Further, in some implementations, when the coating layer includes a layer of topological insulator nanotubes, the average thickness of the coating layer can be less than about 50 times the average diameter of the topological insulator nanotubes. In some implementations, the average thickness of the coating layer can less than about 20 times, less than about 10 times, less than about 5 times, less than about 3 times, or less than about 2 times, less than about 1.5 times, or less than about 1 times the average length of the topological insulator nanotubes.

The coating layer described herein can include or be formed from a plurality of topological insulator platelets connected by micro-wires. In some implementations, a plurality of topological insulator platelets can be disposed on the environment-facing surface of the electronic component, and the plurality of topological insulator platelets can be connected by one or more micro-wires. In some implementations, the topological insulator platelets can be pre-fabricated separately from the electronic component and subsequently disposed upon the environment-facing surface of the electronic component for subsequent connection by micro-wires. For example, in some cases, the topological insulator platelets have a width or diameter from about 1 µm to about 2000 µm, about 50 µm to about 1800 µm, about 200 µm to about 1500 µm, about 400 µm to about 1200 µm, about 1 µm to about 1500 µm, about 500 µm to about 1300 µm, about 1000 µm to about 2000 µm, or about 50 µm to about 1000 µm. Using TI platelets can be or include any of the benefits listed above for the TI nanotubes.

Additionally, micro-wires of the TI coating layer can be formed from any material not inconsistent with the objectives of the present disclosure. For example, in some implementations, the micro-wires are formed from metallic nanoparticles such as gold nanoparticles, polymer microspheres, and/or combinations thereof. The micro-wires can be formed from mixed suspensions of gold and submicron sized polystyrene latex microspheres. Further, the micro-wires can have any size or shape not inconsistent with the objectives of the present disclosure. For example, in some implementations, the micro-wires have a diameter from about 1 nm to about 100 nm, about 10 nm to about 40 nm, about 15 nm to about 50 nm, about 1 nm to about 30 nm, about 15 nm to about 30 nm, or about 15 nm to about 100 nm. Further, in some implementations, the micro-wires have a length from about 15 nm to 5 cm, about 100 nm to about 5 cm, about 500 nm to about 5 cm, about 1 µm to about 5 cm, about 1 mm to about 5 cm, about 15 nm to about 1 cm, about 500 nm to about 1 cm, about 1 cm to about 5 cm, about 1 µm to about 1 cm, about 1 mm to about 1 cm, or about 5 mm to about 3 cm. In some implementations, the micro-wires can be formed by a dielectrophoretic assembly process. These diameters may facilitate manufacturing of the micro-wires.

The coating layer can be disposed directly on the surface of the electronic component. In other implementations, the coating layer can be bonded or adhered to the surface of the electronic component. The bonding can include chemical bonding, physical bonding, covalent bonding, ionic bonding, hydrogen bonding, electrostatic interactions, and van der Waals interactions. In some implementations, the coating layer described herein can be bonded or adhered to the surface of the electronic component with an adhesion energy of at least about 75 mJ/m$^2$ or at least about 100 mJ/m$^2$, when measured by scanning electron microscopy (SEM) according to the method of Zong et al., "Direct measurement of graphene adhesion on silicon surface by intercalation of nanoparticles," J. Appl. Phys., volume 107, page 026104-1 to 026104-3 (2007). Specifically, the adhesion energy (gamma Γ) is given by equation (1):

$$\Gamma = \Lambda E h (w/a)^4 \text{ or .gamma.=.lambda.} * Eh(w/a)^4 \quad (1),$$

where lambda (Λ) is a geometrical factor equal to 1/16, E is 0.5 TPa, h is the thickness of the coating layer, w is a central blister displacement equal to the diameter of an intercalated nanoparticle, and a is a blister radius measured by SEM. The blister is provided by disposing a so-called wedge particle or intercalated nanoparticle between the coating layer and the substrate, as taught by Zong et al. The wedge particle can include a gold or silver nanoparticle having a diameter between about 10 nm and about 100 nm, where the wedge particle is disposed between the electronic component and the coating layer for measurement purposes. In some implementations, the coating layer is bonded or adhered to the surface of the electronic component with an adhesion energy of at least about 150 mJ/m$^2$ when measured as described herein. In some implementations, the coating layer is bonded or adhered to a surface of an electronic component with an adhesion energy between about 50 mJ/m$^2$ and about 300 mJ/m$^2$ or between about 100 mJ/m$^2$ and about 200 mJ/m$^2$. In some implementations, the coating layer described herein resists delamination or other detachment from the electronic component over time, including when exposed to adverse environmental conditions, such as extreme temperatures, high humidity, dust, or electromagnetic radiation exposure, or when exposed to variations or cycles of exposure to such conditions. Further, in some implementations, the coating layer is continuous or substantially continuous across the entire surface of the electronic component.

When an insulating layer is positioned between the electronic component and the coating layer, the insulating material layer can include or be formed from a polymeric material such as a plastic or rubber material. In other cases, the insulating material layer can include or be formed from bi-layer graphene (BLG) or graphene oxide. In some implementations, the insulating material layer can include or be formed from an inorganic material such as silicon dioxide or a ceramic. Graphene has limits due to its fixed physical properties, whereas the TI properties can be varied. In another case involving a clean silicon surface, silicon dioxide would be easier to implement. Ceramics are also a useful alternative, as they are highly insulative, very tough, and easy to incorporate.

Moreover, the insulating layer can have an average thickness of about 10 μm or less, about 1 μm or less, or about 500 nm or less. In some implementations, the insulating layer can have an average thickness from about 100 nm to about 10 μm, about 500 nm to about 10 μm, or about 100 nm to about 1 μm. These thickness values may facilitate manufacturing.

Further, the coated electronic component described herein can exhibit one or more desired properties. In some implementations, for instance, the electronic component with a topological insulator coating can exhibit a high optical transparency, including in the visible region of the electromagnetic spectrum. For reference purposes herein, optical transparency is relative to the total amount of incident radiation in a given wavelength range. Optical transparency can be measured with a broad spectral source or a narrow spectral source. For example, in some implementations, optical transparency is measured with a spectrometer such as a BECKMAN spectrometer.

The coating layer can exhibit an optical transparency of at least about 60 percent, at least about 70 percent, at least about 80%, at least about 90%, or at least about 95% at wavelengths from about 350 nm and about 750 nm. In some implementations, the coating layer can exhibit an optical transparency from about 60% to about 99.99% or about 70% to about 95% at wavelengths from about 350 nm and about 750 nm. Moreover, in some implementations, the coating layer can exhibit an optical transparency from about 60% to about 99.99% or about 75% to about 95% at wavelengths from about 200 nm and about 800 nm or about 220 nm to about 350 nm.

The coating layer can exhibit high water resistance. In some cases, the coating layer can exhibit a water-in-air contact angle of at least about 95 degrees, at least about 100 degrees, or at least about 110 degrees on the environment-facing surface of the electronic component. For example, the coating layer can exhibit a water-in-air contact angle from about 95 degrees to about 130 degrees, about 95 degrees to about 125 degrees, about 95 degrees to about 110 degrees, about 95 degrees to about 105 degrees, or about 95 degrees to about 100 degrees. The water-in-air contact angle can be measured by a static sessile drop method or a dynamic sessile drop method using a contact angle goniometer.

The coating layer can exhibit a high mechanical hardness, stiffness, or resistance to compression. The coating layer can exhibit a tensile modulus of up to about 2 TPa or up to about 1 TPa, when measured by nanoindentation in an atomic force microscope (AFM) according to the method described in Lee et al., "Measurement of the Elastic Properties and Intrinsic Strength of Monolayer Graphene," Science, volume 321, number 5887, pages 385-388 (18 Jul. 2008). Specifically, the tensile modulus is determined by fitting to equation (2):

$$F = \Sigma_0 (\Pi a)(\Delta/a) + E(q^{3a})(\Delta/a)^3 \text{ or}$$

$$F=\text{.sigma..sub.0}(.pi.a)(.delta./a)+E(q.\sup.3 a)(.delta./a).\sup.3 \quad (2),$$

where F is applied force, $\Sigma_0$ is the pretension in the coating layer, a is the membrane diameter, Δ is the deflection at the center point, E is the tensile modulus, and q is a dimensionless constant equal to 1.02. For measurement purposes, the coating layer is disposed on an electronic component having a plurality of circular wells (diameter of about 1 μm to 1.5 μm, depth of about 500 nm). The coating layer deposited over the wells can form a series of free-standing membranes. Mechanical properties are measured by indenting the center of each free-standing membrane with an AFM, as taught by Lee et al. In some implementations, the coated electronic component can exhibit a tensile modulus of up to about 500 Gpa, up to about 100 Gpa, up to about 50 GPa, or up to about 30 GPa when measured by nanoindentation. The coated electronic component can exhibit a tensile modulus from about 1 GPa to about 1 Tpa, about 500 GPa to about 1 TPa, or about 10 GPa to about 30 GPa when measured by nanoindentation in an atomic force microscope.

The TI coating can have one or more of the following features:

(1) an optical transparency between about 60% and about 99.99% at wavelengths between about 200 nm and about 800 nm, (2) a hardness between about 1 GPa and about 1 TPa or between about 500 GPa and about 1 TPa, when measured by nanoindentation, as described above, (3) a water-in-air contact angle from about 95 degrees to about 130 degrees when measured as described above, (4) an adhesion energy of at least about 75 mJ/m.sup.2 or at least about 100 mJ/m.sup.2, when measured as described above, and (5) a thickness of less than about 100 nm or less than about 10 nm.

II. Methods of Coating an Electronic Component

A method of coating the electronic component can include applying a layer of a topological insulator on the environment-facing surface of the electronic component to provide the TI coating layer. Moreover, the method can include applying a layer of electrically insulating material on the environment-facing surface of the electronic component, and the layer of insulating material can be positioned between the environment-facing surface and the TI coating layer.

In one example, TI coating layer can applied using vapor deposition. Vapor deposition can include chemical vapor deposition (CVD). In some implementations, CVD can be used to provide the TI coating layer including one or more topological insulator sheets. For example, one or more of atmospheric pressure CVD, ultrahigh vacuum CVD, or hot filament (or hot wire or catalytic) CVD can be used. In some implementations, the CVD method can include applying the TI coating layer from one or more carbon-containing gas-phase reactants. The gas-phase reactant can be or include a hydrocarbon. The gas-phase reactant can be or include benzene, ethane, methane, or a combination or mixture thereof. The gas-phase reactant can be provided in a carrier gas such as $H_2$.

In other implementations, applying the TI coating layer can be carried out using catalytic vapor phase deposition. Catalytic vapor deposition can be used to provide the TI coating layer including a layer of topological insulator nanotubes having a vertical or substantially vertical orientation. The catalytic vapor phase deposition method can include applying metal catalyst particles on a surface of the electronic component. The metal catalyst particles can be disposed on the electronic component in an array, such as an ordered array of equally spaced particles. Moreover, the size of the metal catalyst particles can be selected to obtain a desired topological insulator nanotube diameter. For example, the metal catalyst particles can have an average diameter ranging from about 1 nm to about 20 nm, about 1 nm to about 10 nm, or less than about 1 nm. The metal catalyst particles can be or include one or more transition metals, including pure metals, metal alloys, or mixtures of metals (e.g., nickel particles, or a noble metal such as gold or silver).

The catalytic vapor phase deposition method can include introducing the electronic component into a vacuum chamber and heating the electronic component. The electronic component including a layer of metal catalyst particles can be heated in the vacuum chamber to a temperature between about 600° C. and about 800° C.

In some implementations, connecting the plurality of topological insulator platelets can be carried out by a dielectrophoretic method. For example, the electronic component with topological insulator platelets disposed on the environment-facing surface can be subjected to dielectrophoresis with a distance between electrodes from about 1 μm to more than about 1 cm, depending on the desired length of microwiring. Nanoparticles formed from a material selected for specific properties such as conductivity can then be introduced into a chamber above the electrodes. In some implementations, the nanoparticles can include gold nanoparticles having a diameter between about 15 nm and about 30 nm. Alternating voltage can then be applied to the dielectrophoretic chamber. Alternating voltage of about 50 V to about 250 V with a frequency of about 50 Hz to about 200 Hz can be applied to the electrodes. Applying alternating voltage can result in the formation of thin, metallic fibers. Regions of topological insulator platelets, can form islands on an otherwise homogeneous substrate, causing micro-wire growth in the direction of the platelets and connecting the platelets to both electrodes. In some implementations, micro-wires can be formed by a dielectrophoretic assembly process described in Hermanson et al. "Dielectrophoretic Assembly of Electrically Functional Microwires from Nanoparticle Suspensions," Science, vol. 294 (5544), pages 1082-1086 (2001).

The method of coating the electronic component can also include removing a portion of the TI coating layer. Removal of a portion of the TI coating layer can result in a smoother or more uniform environment-facing surface of the TI coating layer.

The method can also include applying a layer of electrically insulating material on the environment-facing surface of the electronic component, where the layer of insulating material is positioned between the environment-facing surface and the TI coating layer. The electrically insulating layer can be formed by dip coating or spray coating.

III. Methods of Increasing the Service Lifetime of an Electrical Device

In some implementations, the electrical device can exhibit at least a 100% or at least a 1000% improvement in environmental testing performance compared to an otherwise equivalent electrical device with no coating layer or an otherwise equivalent electronic device with a graphene coating layer. The environmental testing performance includes performance in one or more (e.g., one, two, three, or all four) of a waterproofness test, an acetic acid test, a sugar solution test, and a methyl alcohol test.

Thus, the electrical device with the TI coating layer can exhibit at least a 100% improvement, at least a 1000% improvement, at least a 2000% improvement, at least a 5000% improvement, or at least a 10,000% improvement in a waterproofness test when compared to an otherwise equivalent electrical device with no coating layer and/or when compared to an otherwise equivalent electronic device with a graphene coating layer. As will be appreciated the improvement in the waterproofness test can be less when compared to the otherwise equivalent electronic device with the graphene coating layer than when compared to the otherwise equivalent device with no coating layer. For example, the improvement in the waterproofness test can be about 250% when compared to the otherwise equivalent device with no coating layer and about 150% when compared to the otherwise equivalent electronic device with the graphene coating layer.

The electrical device with the TI coating layer can exhibit at least a 100% improvement, at least a 1000% improvement, at least a 2000% improvement, at least a 5000% improvement, or at least a 10,000% improvement in an acetic acid test when compared to an otherwise equivalent electrical device with no coating layer and/or when compared to an otherwise equivalent electronic device with a graphene coating layer. As will be appreciated the improvement in the acetic acid test can be less when compared to the otherwise equivalent electronic device with the graphene coating layer than when compared to the otherwise equivalent device with no coating layer. For example, the improvement in the acetic acid test can be about 250% when compared to the otherwise equivalent device with no coating layer and about 150% when compared to the otherwise equivalent electronic device with the graphene coating layer.

The electrical device with the TI coating layer can exhibit at least a 100% improvement, at least a 1000% improvement, at least a 2000% improvement, at least a 5000% improvement, or at least a 10,000% improvement in a sugar solution test when compared to an otherwise equivalent electrical device with no coating layer and/or when compared to an otherwise equivalent electronic device with a graphene coating layer. As will be appreciated the improvement in the sugar solution test can be less when compared to the otherwise equivalent electronic device with the graphene coating layer than when compared to the otherwise equivalent device with no coating layer. For example, the improvement in the sugar solution test can be about 250% when compared to the otherwise equivalent device with no coating layer and about 150% when compared to the otherwise equivalent electronic device with the graphene coating layer.

The electrical device with the TI coating layer can exhibit at least a 100% improvement, at least a 1000% improvement, at least a 2000% improvement, at least a 5000% improvement, or at least a 10,000% improvement in a methyl alcohol test when compared to an otherwise equivalent electrical device with no coating layer and/or when compared to an otherwise equivalent electronic device with a graphene coating layer. As will be appreciated the improvement in the methyl alcohol test can be less when compared to the otherwise equivalent electronic device with the graphene coating layer than when compared to the otherwise equivalent device with no coating layer. For example, the improvement in the methyl alcohol test can be about 250% when compared to the otherwise equivalent device with no coating layer and about 150% when compared to the otherwise equivalent electronic device with the graphene coating layer.

The environmental testing performance of an electronic apparatus can be measured as set forth in Environmental Conditions and Test Procedures for Airborne Equipment, Document DO-160 issued by RTCA, Inc., the entirety of which is hereby incorporated by reference.

EXAMPLE 1

TI Coated Electronic Component

An electronic component with a TI coating layer is prepared as follows. A TI coating layer including a flat planar TI sheet is applied to a surface of a cleaned electronic component by disposing the electronic component in a CVD chamber and exposing the electronic component to CVD deposition conditions. Optionally, the electronic component can also have an electrically insulating layer disposed on its surface prior to deposition of the TI coating layer. Specifically, the deposition of the TI coating layer is carried out at 500° C. for approximately 100 minutes in an atmosphere of 100 Torr partial pressure benzene, ethane or methane and 1 Torr partial pressure $H_2$, at a total pressure of approximately 101 Torr. The thickness of the resulting TI coating layer is approximately 100 nm. As described hereinabove, a thinner TI coating layer can be obtained by reducing the deposition time. Further, the deposition time can be selected using information obtained from a microbalance disposed in the chamber and arranged to determine the mass of material deposited on the electronic component as described hereinabove. Because the geometry of the TI is different from graphene, the TI coating layer can be applied to different surfaces than a graphene coating layer. In other words, TIs can take on different shapes than graphene can. Because there are different elements in the TIs, the CVD process can be simplified. Because graphene is only carbon, the hydrogen atmosphere needs to be maintained. It can be possible to grow the TI without the partial gas pressure in the CVD chamber. Also, because there are multiple species involved, the actual dielectric properties of the layer (and therefore the resistance or insulative properties) can be tailored for the TI coating layer.

EXAMPLE 2

TI Coated Electronic Component

An electronic component with a TI coating layer is prepared as follows. A TI coating layer including vertically or substantially vertically oriented nanotubes made from a non-carbon based topological insulator is applied to a surface of a cleaned electronic component by disposing the electronic component in a CVD chamber and exposing the electronic component to catalytic vapor deposition conditions. Optionally, the electronic component can also have an electrically insulating layer disposed on its surface prior to deposition of the TI coating layer. Specifically, the deposition of the TI coating layer is carried out at an electronic component temperature of about 700° C. for approximately 100 minutes in an atmosphere of 100 Torr partial pressure acetylene or ethylene and 5 Torr partial pressure $N_2$ or $NH_3$, at a total pressure of approximately 105 Torr. An array of nickel particles having a diameter of about 10 nm is disposed on the electronic component for the catalytic formation of the nanotubes. The resulting nanotubes are aligned and have an average diameter of about 10 nm and an average length of about 100 nm. The average thickness of the TI coating layer is approximately 20 nm. As in Example 1, the use of the TI can allow different geometries than graphene. The TI also has different electrical properties than graphene. The precise diameter, thickness, and angle of adhesion of the TI can be modified, whereas the same properties of graphene are set and cannot be changed. The modifications can include different geometrical properties or can include dopants into the nanotubes.

EXAMPLE 3

TI Coated Electronic Component

An electronic component with a TI coating layer is prepared as follows. A plurality of TI platelets are applied to an environment-facing surface of an electronic component. Optionally, the electronic component can also have an electrically insulating layer disposed on its surface prior to deposition of the TI platelets. The component is then subjected to dielectrophoresis, with the gap between the electrodes varying from 10-100 μm, depending on the desired length of the micro-wires. The micro-wires form after introduction of a suspension of gold nanoparticles having a diameter of 15-30 nm into a thin chamber above planar metallic electrodes. An alternating voltage of 50 to 250 V and 50 to 200 Hz is applied to the planar electrodes, resulting the in the formation of thin metallic fibers. Conductive TI platelets form small islands on an otherwise homogeneous substrate, causing micro-wire growth in the direction of the platelets, connecting the platelets to both electrodes. The manufacturing of the TI platelets is easier than the manufacturing of similar graphene platelets. Unlike with graphene, no additives are needed to make the TI conductive.

Individual atoms have quantized discrete energy levels which are occupied by each individual atom's electrons. In the case of a solid, however, many atoms are in close proximity to one another and the discrete energy levels of the individual atoms combine to form so-called "energy bands." These energy bands are defined by energies that can be determined by spectroscopically measuring the bandgap in the solid, for example, according to known spectroscopic methods, such as wavelength modulation spectroscopy. Generally, photons having energy values that lie below the bandgap will transmit through the solid while photons having energy values at or above the bandgap will be strongly absorbed. In wavelength modulation spectroscopy, the relative absorption of the photons is correlated with the band density of states.

The energy bands describe electron behavior within the solid. For example, in these energy bands, electron energy can be described as a function of the electron's wave-vector as the electron travels through the solid. Macroscopic behavior of many electrons in the solid—electrical conductivity, thermal conductivity, and the like—result from the band structure. Ordinarily, the geometric construction of solids do not have an effect on the band structure. However, for very thin solids such as graphene, not only does the solid's geometry change but so too does its band structure. That is, for thin solids, the electron behavior changes as the geometry of the solid changes. Thus, whether a solid is a defined as a "2D-" or "3D-structure" depends on the solid's band structure. For example, graphene is monoatomic and its 2D band structure only exists when it is one atomic layer thick. The addition of more atomic layers (i.e., from single-layer graphene to few-layer graphene) not only increases graphene's thickness, but also changes its band structure toward its 3D configuration. In contrast, topological insulators comprise several different atoms and can be molecularly engineered. Thus, unlike graphene which faces the aforementioned issues to changes in its band structure, a topological insulator largely maintains its 2D band structure even as the material's thickness is changed.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. As used herein, the term "at least one of A and B" with respect to a listing of items such as, for example, A and B, means A alone, B alone, or A and B. Those skilled in the art will recognize that these and other variations are possible. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method for increasing a service lifetime of an electronic component, comprising:
   applying an intermediary insulating layer on the electronic component;
   applying a topological insulator coating layer on the intermediary insulating layer, wherein the topological insulator coating layer comprises a three-dimensional topological insulator coating layer that is configured to conduct electrical current along a surface of the topological insulator coating layer but not through the topological insulator coating layer, wherein the topological insulator coating layer comprises nanotubes that are arranged to be substantially horizontal or substantially vertical to vary an electrical property of the topological insulator coating layer, wherein the topological insulator coating layer comprises at least one element selected from bismuth, antimony, selenium, and tellurium, and wherein the nanotubes does not comprise carbon; and
   performing a test on the electronic component with the topological insulator coating layer applied thereto, wherein:
      the electronic component with the topological insulator coating layer exhibits at least a 100% improvement during the test when compared to an otherwise equivalent electronic component without the topological insulator layer applied thereto,
      the electronic component with the topological insulator coating layer exhibits at least a 100% improvement during the test when compared to an otherwise equivalent electronic component with a graphene layer applied thereto, and
      the test comprises at least one of: a waterproofness test, an acetic acid test, a sugar solution test, and a methyl alcohol test.

2. The method of claim 1, wherein the test comprises the waterproofness test.

3. The method of claim 1, wherein the test comprises the acetic acid test.

4. The method of claim 1, wherein the test comprises the sugar solution test.

5. The method of claim 1, wherein the test comprises the methyl alcohol test.

6. The method of claim 1, wherein the electronic component with the topological insulator coating layer exhibits at least a 1000% improvement during the test when compared to an otherwise equivalent electronic component without the topological insulator layer applied thereto.

7. The method of claim 1, wherein the electronic component with the topological insulator coating layer exhibits at least a 1000% improvement during the test when compared to an otherwise equivalent electronic component with a graphene layer applied thereto.

8. The method of claim 1, wherein the topological insulator coating layer comprises at least one compound selected from bismuth selenide ($Bi_2Se_3$), bismuth telluride ($Bi_2Te_3$), and antimony telluride ($Sb_2Te_3$).

9. The method of claim 1, wherein the topological insulator coating layer comprises a plurality of layers of a topological insulator, each layer of the plurality of layers physically contacting at least one adjacent layer of the plurality of layers.

10. The method of claim 1, wherein the topological insulator coating layer has a thickness ranging from about 10 nm to about 100 nm.

11. The method of claim 1, wherein:
the electronic component comprises an electrical contact, a transformer, a resistor, a capacitor, an inductor, a microprocessor, an integrated circuit, a memory device, a circuit board, or a combination thereof; and
the topological insulator coating layer is on, and physically contacts, an environment-facing surface of the electronic component.

12. The method of claim 1, wherein the topological insulator coating layer comprises a plurality of platelets connected by micro-wires.

13. The method of claim 1, wherein the topological insulator coating layer is applied using vapor deposition.

14. The method of claim 1, further comprising removing a portion of the topological insulator coating layer after applying the topological insulator coating layer.

15. The method of claim 1, further comprising coupling or adhering the electronic component with the topological insulator coating layer applied thereto to an exterior surface of an aircraft.

16. The method of claim 1, wherein the intermediary insulating layer comprises graphene.

17. The method of claim 1, wherein the intermediary insulating layer comprises bi-layer graphene, graphene oxide, or a combination thereof.

18. The method of claim 1, wherein the intermediary insulating layer comprises a polymer.

19. The method of claim 1, wherein the intermediary insulating layer comprises silicon dioxide.

20. The method of claim 1, wherein the intermediary insulating layer comprises a ceramic.

21. The method of claim 1, wherein the topological insulator layer comprises a single layer having a thickness from about 400 nm to about 10 μm.

22. The method of claim 1, further comprising producing the topological insulator coating layer using a chemical vapor deposition process without hydrogen.

23. The method of claim 1, further comprising modifying a dielectric property of the topological insulator coating layer to tailor the topological insulator coating layer to the electronic component.

24. The method of claim 1, wherein the topological insulator coating layer is produced without additives to make the topological insulator coating layer conductive.

25. The method of claim 1, wherein the topological insulator coating layer comprises nanotubes that are arranged to be substantially horizontal to vary an electrical property and a volume of the topological insulator coating layer, and wherein the nanotubes do not comprise carbon.

26. The method of claim 25, wherein the nanotubes are arranged to be substantially horizontal to increase a conductance and to decrease a volume of the topological insulator coating layer.

27. The method of claim 1, wherein the topological insulator coating layer comprises nanotubes that are arranged to be substantially vertical to vary an electrical property and a volume of the topological insulator coating layer, and wherein the nanotubes do not comprise carbon.

28. The method of claim 27, wherein the nanotubes are arranged to be substantially vertical to decrease a conductance and to increase a volume of the topological insulator coating layer.

29. The method of claim 1, further comprising adding a dopant to the topological insulator coating layer to modify an angle of adhesion of the topological insulator coating layer.

30. A method for increasing a service lifetime of an electronic component, comprising:
applying an intermediary insulating layer on the electronic component, wherein the intermediary insulating layer comprises graphene, and wherein the electronic component comprises an electrical contact, a transformer, a resistor, a capacitor, an inductor, a microprocessor, an integrated circuit, a memory device, a circuit board, or a combination thereof;
applying a topological insulator coating layer on the intermediary insulating layer, wherein the topological insulator coating layer comprises a three-dimensional topological insulator coating layer, wherein the topological insulator coating layer comprises platelets, wherein the platelets have a width or diameter from about 400 μm to about 1200 μm, wherein the topological insulator coating layer comprises at least one compound selected from bismuth selenide ($Bi_2Se_3$), bismuth telluride ($Bi_2Te_3$), and antimony telluride ($Sb_2Te_3$), wherein the topological insulator coating layer does not comprise carbon, wherein the topological insulator layer comprises a single layer having a thickness from about 400 nm to about 10 μm;
subjecting the topological insulator coating layer to dielectrophoresis using two or more electrodes that are separated by about 1 μm to about 1 cm to connect two or more of the platelets via one or more micro-wires; and
performing a test on the electronic component with the topological insulator coating layer applied thereto, wherein:
the electronic component with the topological insulator coating layer exhibits at least a 1000% improvement during the test when compared to an otherwise equivalent electronic component without the topological insulator layer applied thereto,
the electronic component with the topological insulator coating layer exhibits at least a 1000% improvement during the test when compared to an otherwise equivalent electronic component with a graphene layer applied thereto, and
the test comprises: a waterproofness test, an acetic acid test, a sugar solution test, and a methyl alcohol test.

* * * * *